United States Patent
Heo et al.

(10) Patent No.: US 10,289,226 B2
(45) Date of Patent: May 14, 2019

(54) TOUCH SENSOR AND ORGANIC LIGHT EMITTING DISPLAY DEVICE INCLUDING THE SAME

(71) Applicant: LG Display Co., Ltd., Seoul (KR)

(72) Inventors: Jong Gu Heo, Seoul (KR); Jong Hee Hwang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/604,234

(22) Filed: May 24, 2017

(65) Prior Publication Data
US 2017/0344165 A1    Nov. 30, 2017

(30) Foreign Application Priority Data
May 31, 2016    (KR) .................. 10-2016-0067787

(51) Int. Cl.
G06F 3/041    (2006.01)
G06F 3/044    (2006.01)
G06F 3/045    (2006.01)
H01L 27/32    (2006.01)
H01L 51/00    (2006.01)

(52) U.S. Cl.
CPC ............ *G06F 3/0412* (2013.01); *G06F 3/044* (2013.01); *G06F 3/045* (2013.01); *G06F 3/0414* (2013.01); *G06F 3/0416* (2013.01); *H01L 27/323* (2013.01); *H01L 51/0097* (2013.01); *G06F 2203/04102* (2013.01); *G06F 2203/04105* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | |
|---|---|---|
| 2010/0253651 A1 | 10/2010 | Day |
| 2011/0234517 A1 | 9/2011 | Ando |
| 2011/0273396 A1 | 11/2011 | Chung |
| 2014/0076063 A1 | 3/2014 | Lisseman et al. |
| 2015/0084909 A1 | 3/2015 | Worfolk et al. |
| 2016/0048266 A1* | 2/2016 | Smith .................. G06F 3/0418 345/174 |
| 2016/0085336 A1 | 3/2016 | Kim et al. |
| 2017/0206877 A1 | 7/2017 | Ahn |

FOREIGN PATENT DOCUMENTS

WO    WO 2016053068    4/2016

OTHER PUBLICATIONS

Extended European Search Report for European Patent Application No. EP 17172447.9, dated Oct. 5, 2017, 10 Pages.
European Patent Office, Communication Pursuant to Article 94(3) EPC, Feb. 18, 2019, five pages.

* cited by examiner

*Primary Examiner* — Amare Mengistu
*Assistant Examiner* — Sarvesh J Nadkarni
(74) *Attorney, Agent, or Firm* — Fenwick & West LLP

(57) ABSTRACT

Provided is a touch force sensing device. The touch force sensing device comprises a first substrate, a resistor on one surface of the first substrate, a second substrate facing the first substrate, a driving electrode disposed on a surface of the second substrate facing the first substrate and spaced from the resistor and a sensing electrode disposed on the same surface as the driving electrode and electrically connected to the driving electrode through the resistor by an external touch input.

21 Claims, 8 Drawing Sheets

TOUCH SENSOR AND ORGANIC LIGHT EMITTING DISPLAY DEVICE INCLUDING THE SAME

CROSS-REFERENCE TO RELATED APPLICATIONS

This application claims the priority of Korean Patent Application No. 10-2016-0067787 filed on May 31, 2016, in the Korean Intellectual Property Office, the disclosure of which is incorporated herein by reference.

BACKGROUND

Technical Field

The present disclosure relates to a touch sensor and an organic light emitting display device including the touch sensor.

Description of the Related Art

Image display devices that output information on a screen are being developed into thinner, lighter-weight, portable and high-performance forms. Recently, an organic light emitting display device configured to display an image by controlling the amount of light emitted from an organic light emitting diode (OLED) has attracted significant attention.

The organic light emitting diode is a self-emitting device using a thin emission layer between electrodes and can be manufactured into a thin film. A general organic light emitting display device has a structure in which a pixel driving circuit and an organic light emitting diode are formed on a substrate. Further, the general organic light emitting display device displays an image when a light emitted from the organic light emitting diode passes through the substrate or a barrier layer.

The organic light emitting display device is implemented without a separate light source and thus can be easily implemented as a flexible display device that can be bent, folded, stretched or otherwise deformed in a desirable manner. In this case, flexible materials such as plastic, metal foil, and the like are used for the substrate of the organic light emitting display device. Generally, polyimide (PI) is employed for the substrate of the organic light emitting display device among various flexible materials.

Also, display devices having a touch input function are being widely used. A so-called touch screen panel (TSP) is a device configured to sense a user's input such as a touch or a gesture with respect to a display device. Touch screen panels are implemented in portable devices such as smart phones and tablet PCs and a large-sized display devices such as signage or displays in public facilities, smart TVs, and the like. Such touch screen panels can be classified into resistive, capacitive, optical, and electromagnetic (EM) touch screen panels according to their basic operation principles. Recently, the demand for touch screen panels capable of sensing different types of touch inputs have been increased. Accordingly, research on enhanced touch panels capable of more accurately measuring a position of a touch input and the force thereof is being actively conducted.

SUMMARY

An object to be achieved by an embodiment of the present disclosure is to provide a touch panel capable of three-dimensionally sensing a touch input and/or an organic light emitting display device including the touch panel. The objects of the present disclosure are not limited to the aforementioned, as other objects will be apparent to a person having ordinary skill in the art from the following description.

According to an embodiment of the present disclosure, a particular touch force sensing device is provided. The touch force sensing device includes: a first substrate; a resistor on one surface of the first substrate; a second substrate facing the first substrate; a driving electrode on a surface of the second substrate facing the first substrate and spaced from the resistor; and a sensing electrode on the same surface as the driving electrode and electrically connected to the driving electrode through the resistor by an external touch input.

According to another embodiment of the present disclosure, there is provided an organic light emitting display device. The organic light emitting display device includes: a flexible substrate; an organic light emitting diode disposed on a first surface of the flexible substrate; and a force sensor on a second surface opposite to the first surface of the flexible substrate. The force sensor is configured to detect a resistance which is changed depending on the intensity of a touch input using a resistor and an electrode spaced from each other at a predetermined distance.

In one embodiment, a display device comprises a display panel and a touch force sensing device overlapping with the display panel. The touch force sensing device comprises a force driving electrode and a first force sensing electrode spaced apart from the force driving electrode. A resistor is separated from the force driving electrode and the first force sensing electrode by a gap. A contact area between the force driving electrode and the resistor varies depending on a force of a touch, and a contact area between the first force sensing electrode and the resistor varies depending on the force of the touch.

Details of other exemplary embodiments will be included in the detailed description of the disclosure and the accompanying drawings.

According to an embodiment of the present disclosure, electronic devices can be further provided with a function of sensing the force of a touch input and thus can provide various UI/UX to users. Further, according to an embodiment of the present disclosure, a display device includes a touch screen panel capable of sensing the force of a touch input, but that still has a small thickness. Therefore, the electronic devices according to an embodiment of the present disclosure can be advantageously implemented to be flexible.

Meanwhile, according to an embodiment of the present disclosure, a touch force sensing device performs a buffering function and/or a heat-sink function and thus can contribute to improvement of the reliability of an electronic device combined therewith. The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
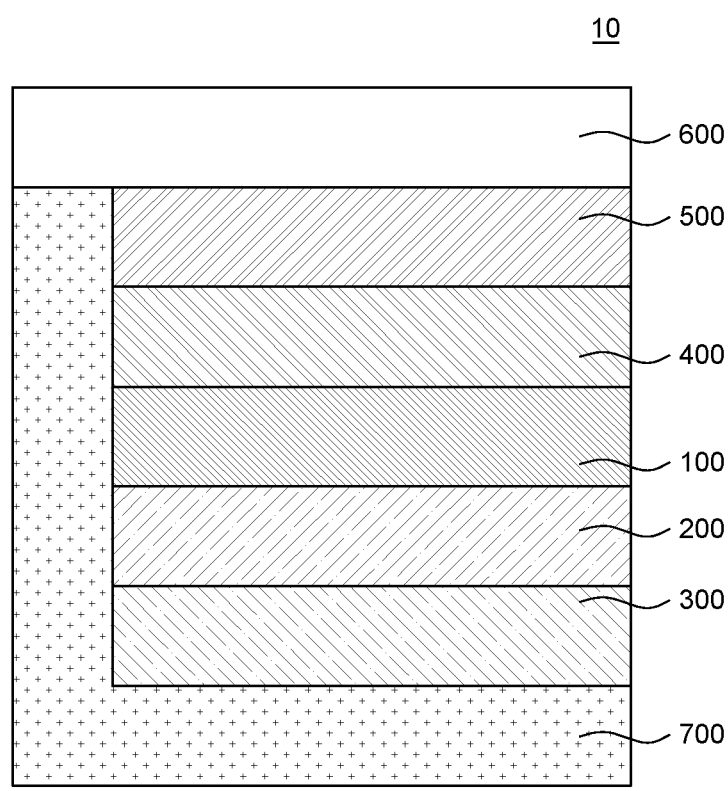
FIG. 1 is a plan view illustrating an electronic device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are described to allow a person having ordinary skill in the art to practice the invention, and the present disclosure shall be defined by the appended claims.

The shapes, sizes, ratios, angles, numbers, and the like illustrated in the accompanying drawings for describing the exemplary embodiments are merely examples, and the present disclosure is not limited thereto. Like reference numerals generally denote like elements throughout the present disclosure. Further, in the following description, a detailed explanation of certain technologies may have been omitted merely to avoid unnecessarily obscuring of the subject matter in the present disclosure. The terms such as "including," "having," and "comprising" used herein are generally intended to allow other components to be added unless specifically limited by the term "only". Any references to singular items may include a plurality of such items unless expressly stated otherwise. Components and processes should be interpreted to include an ordinary error margin or range even if not expressly stated.

When a positional relationship between two parts is described using the terms such as "on", "above", "below", and "next", one or more other parts may exist between the two parts unless specifically limited by the term "immediately" or "directly". When an element or layer is referred to as being "on" another element or layer, it may be directly on the other element or layer, or intervening elements or layers may be present. It is to be understood that when one element is referred to as being "connected to" or "coupled to" another element, it may be directly connected or coupled to another element, or indirectly connected or coupled via one or more other elements.

Although the terms "first", "second", and the like are used for describing various components, these components are not confined by these terms. These terms are merely used for distinguishing one component from another component. Therefore, a first component to be mentioned below may be interpreted as a second component, or vice versa, in accordance with the technical concepts of the present disclosure.

Since the size and thickness of each component illustrated in the drawings are represented for convenience in explanation, the technical concepts herein are not necessarily limited to the illustrated size and thickness of each component. Hereinafter, various exemplary embodiments of the present disclosure will be described in detail with reference to the accompanying drawings.

FIG. 1 is a plan view illustrating an electronic device according to an exemplary embodiment of the present disclosure.

The electronic device may include various devices including a display device 10, for example, a TV, a monitor, a notebook PC, a smartphone, a wearable electronic device, and the like. Further, the electronic device may include a touch input sensing device capable of sensing a pressure (from touch contact) applied to a specific portion (for example, at some portion on the display screen) of the display device by a finger, a touch pen, and the like. The touch input sensing device may be provided to sense a position (e.g., coordinates) of a spot applied with a touch input and/or a force (e.g., intensity, pressure) of the touch input. The touch input sensing device may be configured as a single panel or integrated element. Otherwise, the touch input sensing device may be configured as a touch position sensing device (a first touch panel 400) that senses a position of a touch input and a touch force sensing device (a second touch panel 300) that senses the force of the touch input as illustrated in FIG. 1. The touch position sensing device 400 may also be simply referred to as a touch sensor, and the touch force sensing device 300 may also be simply referred to as a force sensor.

In an exemplary embodiment, the display device 10 may include an organic light emitting display panel 100, a support layer 200, the touch force sensing device 300, the touch position sensing device 400, a polarizing film 500, an upper cover 600, a housing 700, and the like, all of which are overlapping with one another.

The organic light emitting display panel 100 includes pixels that collectively display an image, an organic light emitting diode that drives the pixels, various circuits, and functional units. For example, the organic light emitting display panel 100 may include a base substrate, a pixel driving circuit and an organic light emitting diode (TFT/OLED), and a passivation layer. The pixel driving circuit and the organic light emitting diode (TFT/OLED) are disposed on one surface of the base substrate. The pixel driving circuit (for example, having one or more transistors, capacitors, and the like.) for driving the organic light emitting diode and lines may be disposed on the one surface or the other surface of the base substrate in association with the organic light emitting diode. A detailed configuration of the organic light emitting display panel 100 will be described with reference to FIG. 2 and FIG. 3.

If the base substrate of the organic light emitting display panel 100 is formed of a plastic material having flexibility, the support layer 200 may be further disposed under the organic light emitting display panel 100. The support layer 200 supports the flexible substrate so that the flexible substrate does not become excessively bent or torn. The support layer 200 or back plate supports the substrate in the form of a thin film layer and thus enhances the stiffness of the organic light emitting display panel 100. The support layer 200 may be formed of one or more materials selected from polyethylene naphthalate (PEN), ployethylene terephthalate (PET), polyethylene ether phthalate, polycarbonate, polyarylate, polyether imide, polyether sulfonate, polyimide, or polyacrylate. Meanwhile, in another exemplary embodiment different from the exemplary embodiment illustrated in FIG. 1, the support layer 200 may be omitted and the touch force sensing device 300 itself may be a substitute for the support layer.

The touch position sensing device 400 may be positioned on the top side of the organic light emitting display panel 100. The touch position sensing device 400 is provided to detect a two-dimensional position to which a user's touch input is applied. The touch position sensing device 400 can be implemented as a resistive, capacitive, optical, electromagnetic (EM) sensing device, or the like. For example, the touch position sensing device 400 based on mutual capacitance can operate in the following manner. A touch driving signal may be applied to a first touch electrode of the touch position sensing device 400, and a second touch electrode may be grounded. In this case, mutual capacitance is formed between the first touch electrode and the second touch electrode. If the user's touch input is applied, the mutual capacitance between the first touch electrode and the second touch electrode may be changed due to the user's finger (conductor). In this case, a position of the touch input may be detected by calculating two-dimensional coordinates of a touch cell where the mutual capacitance is changed.

The touch force sensing device 300 may be positioned under the organic light emitting display panel 100 at the bottom side of the display panel 100, which is opposite to the top side of the display panel 100. The touch force sensing device 300 is provided to detect the force (i.e. pressure) of the user's touch input. Like the touch position sensing device 400, the touch force sensing device 300 can be implemented as a resistive, capacitive, optical, electromagnetic sensing device, or the like. If the touch force sensing device 300 is implemented as a resistive sensing device, the touch position sensing device 400 may have a function and a shape as illustrated in FIG. 4 through FIG. 8. If the display device 10 is a flexible display device, some components (for example, electrode, spacer, and the like) of the touch position sensing device 400 may be provided at a lower density in an area (bent area, and the like) where the flexible display device (substrate) is bent. Meanwhile, the touch position sensing device 400 and the touch force sensing device 300 may be manufactured into an integrated panel and then disposed on or under the organic light emitting display panel 100. Even if the touch position sensing device 400 and the touch force sensing device 300 are separately implemented, they may be driven/controlled by a single controller. In this case, the controller may be a module implemented within an integrated circuit chip (IC chip) to control both the touch force sensing device 300 and the touch position sensing device 400. The touch force sensing device 300 (i.e., force sensor) may be provided to compensate for a change in resistance value depending upon temperature. For example, the touch force sensing device 300 (force sensor) may be configured to detect a temperature change on the basis of a capacitance change of the touch position sensing device 400 (touch sensor).

A heat-sink layer may be positioned between the organic light emitting display panel 100 and the touch force sensing device 300. The heat-sink layer dissipates heat transferred from the organic light emitting display panel (i.e., base substrate).

The polarizing film 500 may be positioned on the touch position sensing device 400. The polarizing film 500 suppresses external light reflections. If the polarizing film 500 is present, the visibility of the display device 10 can be further improved.

The upper cover 600 may be positioned on the polarizing film 500. The upper cover 600 protects the display device 10 against the external environment. The upper cover 600 may be formed as a colorless and transparent glass substrate or a transparent plastic substrate in order to minimize any reduction in visibility of the display panel 100.

The housing 700 forms the outermost back surface and lateral surface of the display device. The housing 700 has a space in which the display panel 100, the touch input sensing devices 300 and 400, the polarizing film 500, and the like can be accommodated. The housing 700 protects the display device 10 together with the upper cover 600.

Figure 2:
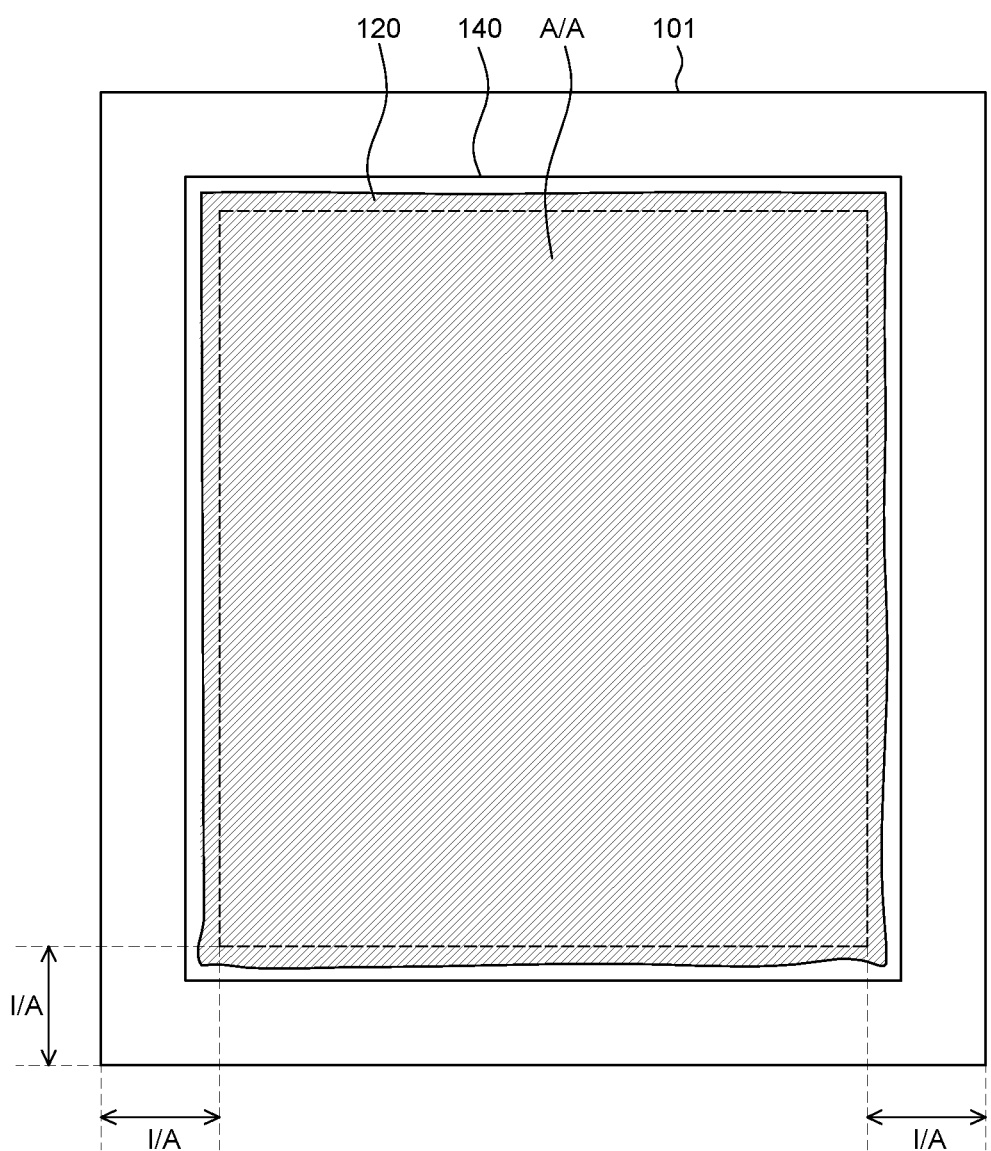
FIG. 2 is a plan view illustrating an organic light emitting display panel according to an exemplary embodiment of the present disclosure.

FIG. 2 is a plan view illustrating an organic light emitting display panel according to an exemplary embodiment of the present disclosure.

Referring to FIG. 2, the organic light emitting display panel 100 includes at least one active area A/A, and an array of pixels is disposed in the active area. One or more inactive areas I/A may be disposed around the active area. That is, the inactive area may be adjacent to one or more lateral surfaces of the active area. In FIG. 2, the inactive area surrounds the rectangular active area. However, a shape of the active area and a shape/layout of the inactive area adjacent to the active area are not limited to the example illustrated in FIG. 2. The active area and the inactive area may have the shapes suitable for a design of an electronic device equipped with the display panel 100. The active area may have, for example, a pentagonal shape, a hexagonal shape, a circular shape, an oval shape, and the like.

Each pixel in the active area A/A may be associated with a pixel driving circuit. The pixel driving circuit may include one or more switching transistors and one or more driving transistors. Each pixel driving circuit may be electrically connected to a gate line and a data line to communicate with a gate driver and a data driver positioned in the inactive area.

The gate driver and the data driver may be implemented as thin film transistors (TFTs) in the inactive area I/A. These drivers may be referred to as GIP (gate-in-panel) due to their configurations. Further, some components such as the data driver IC may be mounted on a separate printed circuit board and may be combined with a connection interface (pad, bump, pin, and the like) disposed in the inactive area through a circuit film such as an FPCB (flexible printed circuit board), a COF (chip-on-film), and a TCP (tape-carrier-package). The printed circuit (COF, PCB, and the like) may be positioned on the back of the display panel 100.

The organic light emitting display panel 100 may include various additional components configured to generate various signals or drive the pixels in the active area. An additional component for driving the pixels may include an inverter circuit, a multiplexer, an electrostatic discharge circuit, and the like. The organic light emitting display panel 100 may include an additional component associated with a function other than the function of driving pixels. For example, the organic light emitting display panel 100 may include additional components that provide a touch sensing function, a user authorization function (for example, fingerprint recognition), a multi-level pressure sensing function, a tactile feedback function, and the like. The above-described additional components may be positioned in the inactive area and/or an external circuit connected to the connection interface.

The organic light emitting display panel according to the present disclosure may include a substrate 101 on which a thin film transistor and an organic light emitting diode are disposed, an encapsulation layer 120, a barrier film 140, and the like.

The substrate 101 supports various components of the organic light emitting display panel 100. The substrate 101 may be formed of a transparent insulating material, for example, glass, plastic, and the like. The substrate (array substrate) may also be referred to as a structure including components and functional layers formed thereon, for example, the switching TFT, the driving TFT connected to the switching TFT, the organic light emitting diode connected to the driving TFT, the passivation layer, and the like.

The organic light emitting diode is disposed on the substrate 101. The organic light emitting diode includes an anode, an organic emission layer formed on the anode, and a cathode formed on the organic emission layer. The organic light emitting diode may have a structure of a single emission layer that emits a single light, or may have a structure of a plurality of emission layers that emits a white light. If the organic light emitting diode emits a white light, a color filter (or color refiner) may be further provided. The organic light emitting diode may be formed on a central portion of the substrate 101 corresponding to the active area.

An encapsulation layer 120 may cover the organic light emitting diode. The encapsulation layer protects the organic light emitting diode against moisture or oxygen. A barrier film 140 may be positioned on the encapsulation layer 120.

Figure 3:
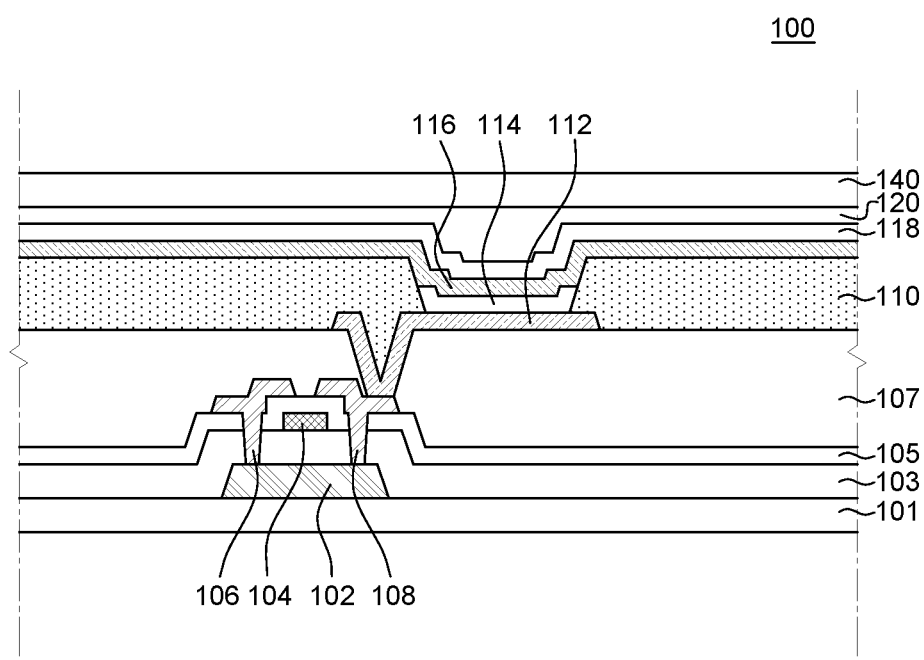
FIG. 3 is a cross-sectional view illustrating a part of an active area in an organic light emitting display panel according to a first exemplary embodiment of the present disclosure.

FIG. 3 is a cross-sectional view illustrating a part of an active area in an organic light emitting display panel according to a first exemplary embodiment of the present disclosure.

Referring to FIG. 3, in the organic light emitting display panel 100, thin film transistors (comprised of elements 102, 104, 106, and 108), organic light emitting diodes (comprised of elements 112, 114, and 116), and various functional layers are positioned on the substrate 101.

The substrate 101 (or array substrate) may be a glass or plastic substrate. Incase of a plastic substrate, the substrate may be formed using a polyimide-based or polycarbonate-based material and thus may have flexibility. Particularly, polyimide can be applied to a high-temperature process and can be used for coating. Therefore, polyimide has been widely used for a plastic substrate.

A buffer layer may be positioned on the substrate 101. The buffer layer is a functional layer configured to protect the thin film transistors (TFTs) against impurities such as alkali ions discharged from the substrate 101 or its lower layers. The buffer layer may be formed of silicon oxide (SiOx), silicon nitride (SiNx), or a multilayer thereof.

The thin film transistor may have a structure in which a semiconductor layer 102, a gate insulation film 103, a gate electrode 104, an interlayer insulation film 105, and source and drain electrodes 106 and 108 are disposed in sequence. The thin film transistor (TFT) may be a P-type TFT or an N-type TFT. The P-type TFT refers to a TFT in which ions of a channel are doped with a Group III element such as boron to create a current flow by the movement of holes, and may also be referred to as "PMOS". The N-type TFT refers to a TFT in which ions of a channel are doped with a Group V element such as phosphorus to create a current flow by the movement of electrons, and may also be referred to as "NMOS". The semiconductor layer 102 is positioned on the buffer layer 130 (not shown in FIG. 3). The semiconductor layer 102 may be formed of polysilicon (p-Si). In this case, a particular area may be doped with impurities. Further, the semiconductor layer 102 may be formed of amorphous silicon (a-Si) or may be formed of various organic semiconductor materials such as pentacene. Further, the semiconductor layer 102 may be formed of oxide. The gate insulation film 103 may be formed of an inorganic insulating material such as silicon oxide (SiOx) or silicon nitride (SiNx), or may be formed of an organic insulating material. The gate electrode 104 may be formed of various conductive materials, for example, magnesium (Mg), aluminum (Al), nickel (Ni), chromium (Cr), molybdenum (Mo), tungsten (W), gold (Au), or an alloy thereof.

The interlayer insulation film 105 may be formed of an insulating material such as silicon oxide (SiOx) or silicon nitride (SiNx), or may be formed of an organic insulating material. A contact hole through which source and drain regions are exposed may be formed by selectively removing the interlayer insulation film 105 and the gate insulation film 103.

The source and drain electrodes 106 and 108 are formed of an electrode material as a single layer or of multiple layers on the interlayer insulation film 105.

An overcoat layer 107 may be positioned on the thin film transistor. The overcoat layer 107 protects the thin film transistor and flattens an upper part thereof. The overcoat layer 107 may be formed into various shapes and may be formed as an organic insulation film such as BCB (benzocyclobutene) or acryl, or an inorganic insulation film such as a silicon nitride film (SiNx) or a silicon oxide film (SiOx). Further, the overcoat layer 107 may be variously formed as a single layer, a double layer, a multilayer structure, or the like.

The organic light emitting diode may have a structure in which a first electrode 112, an organic emission layer 114, and a second electrode 116 are disposed in sequence. That is, the organic light emitting diode may include the first electrode 112 formed on the overcoat layer 107, the organic emission layer 114 positioned on the first electrode 112, and the second electrode 116 positioned on the organic emission layer 114.

The first electrode 112 is electrically connected to the drain electrode 108 of the driving transistor through the contact hole. If the organic light emitting display panel 100 is of a top-emission type, the first electrode 112 may be formed of an opaque conductive material having a high reflectivity. For example, the first electrode may be formed of silver (Ag), aluminum (Al), gold (Au), molybdenum (Mo), tungsten (W), chromium (Cr), or an alloy thereof.

A bank 110 is formed in the other areas except for an emission area. Therefore, the bank 110 includes a bank hole through which the first electrode 112 corresponding to the emission area is exposed. The bank 110 may be formed of an inorganic insulating material such as a silicon nitride film (SiNx) or a silicon oxide film (SiOx) or an organic insulating material such as BCB, acryl-based resin, or imide-based resin.

The organic emission layer 114 is positioned on the first electrode 112 exposed by the bank 110. The organic emission layer 114 may include an emission layer, an electron injection layer, an electron transport layer, a hole transport layer, a hole injection layer, and the like.

The second electrode 116 is positioned on the organic emission layer 114. If the organic light emitting display panel 100 is of a top-emission type, the second electrode 116 may be formed of a transparent conductive material such as indium tin oxide (ITO) or indium zinc oxide (IZO). Thus, a light generated by the organic emission layer 114 may be output to an upper side of the second electrode 116.

A passivation layer 118 and the encapsulation layer 120 are positioned on the second electrode 116. The passivation layer 118 and the encapsulation layer 120 block permeation of oxygen and moisture in order to suppress oxidation of a light emitting material and an electrode material. If the organic light emitting diode is exposed to moisture or oxygen, pixel shrinkage which is a reduction of the emission area may occur or a dark spot may be generated in the emission area. The passivation layer and/or the encapsulation layer may be configured as an inorganic film formed of glass, metal, aluminum oxide (AlOx), or silicon (Si)-based material. Otherwise, the passivation layer and/or the encapsulation layer may have a structure in which an organic film and an inorganic film are alternately laminated. The inorganic film functions to block permeation of moisture or oxygen, and the organic film functions to flatten a surface of the inorganic film. The encapsulation layer may be formed as a plurality of thin films. This is because the plurality of thin films increases and complicates a permeation path of moisture or oxygen as compared with a single layer, which makes it difficult for moisture/oxygen to permeate into the organic light emitting diode.

The barrier film 140 can be positioned on the encapsulation layer 120 so as to encapsulate the entire substrate 101 including the organic light emitting diode. The barrier film 140 may be a retardation film or an optically-isotropic film. If the barrier film 140 has optical isotropy, the barrier film transmits a light incident into the barrier film without phase retardation. Further, an organic film or an inorganic film may be further disposed on an upper or lower surface of the barrier film. The organic film or the inorganic film disposed on the upper or lower surface of the barrier film functions to block permeation of moisture or oxygen.

An adhesive layer may be positioned between the barrier film 140 and the encapsulation layer 120. The adhesive layer bonds the encapsulation layer 120 and the barrier film 140. The adhesive layer may be a thermally curable or naturally curable adhesive. For example, the adhesive layer may be formed of a barrier pressure sensitive adhesive (B-PSA).

The touch position sensing device 400, the polarizing film 500, the upper cover 600, and the like may be positioned on the barrier film 140.

Meanwhile, an adhesive layer and a support layer may be disposed under the substrate 101. The support layer is a back plate configured to support the substrate 101 so as not to be excessively bent. The adhesive layer is formed of a thermally curable or naturally curable adhesive and functions to bond the substrate 101 and the support layer. For example, the adhesive layer may be formed of an optical clear adhesive (OCA).

Figure 4:
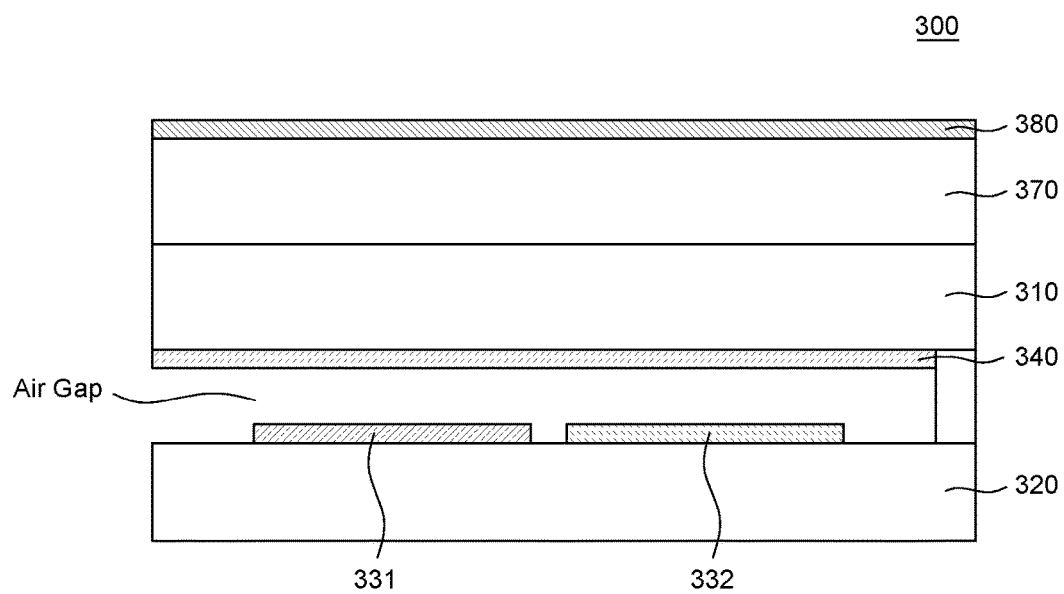
FIG. 4 and FIG. 5 illustrate parts of a cross-sectional view of a touch force sensing device according to an exemplary embodiment of the present disclosure.

FIG. 4 illustrates a part of a cross-sectional view of a touch force sensing device according to an exemplary embodiment of the present disclosure.

The touch force sensing device 300 is provided to detect the force (i.e., strength, pressure, etc.) of a touch input applied to an electronic device (for example, display device).

For example, if the touch force sensing device 300 is implemented as a capacitive sensor, the touch force sensing device 300 detects a change in capacitance between upper and lower electrodes when a touch input is applied and then determines the force. This sensing method depends on a change in distance between the electrodes. Thus, it is necessary to maintain a vertical gap between the electrodes for accurate sensing. Herein, the vertical gap between the electrodes is maintained by an air layer or a gap maintaining member such as an elastic body (or an elastomer). If an elastic body is used as the gap maintaining member, it may be difficult to reduce the overall thickness of the touch force sensing device 300. Also, when the touch force sensing device 300 is applied in a curved or bent electronic device, a gap between the electrodes may not be uniformly maintained.

Meanwhile, if the touch force sensing device 300 is implemented as a resistive sensor, the touch force sensing device 300 detects a change in resistance between electrodes when a touch input is applied and then determines the force. FIG. 4 illustrates an example of the touch force sensing device (force sensor) implemented as a resistive type sensor.

Figure 5:
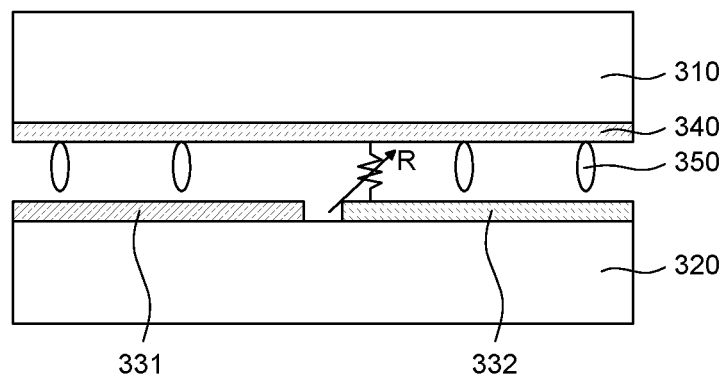

Hereinafter, the touch force sensing device according to an exemplary embodiment of the present disclosure will be described with reference to FIG. 4 and FIG. 5. The touch force sensing device 300 may include: a first substrate 310; a second substrate 320; a resistor 340; a driving electrode 331; a sensing electrode 332, and the like. Further, the touch force sensing device 300 may further include a controller (control circuit), a spacer 350, a heat-sink layer 380, and the like.

The first substrate 310 and the second substrate 320 are disposed to face each other. The first substrate 310 and/or the second substrate may be formed of one or more materials selected from transparent polymer materials, for example, polyethylene naphthalate (PEN), ployethylene terephthalate (PET), polyethylene ether phthalate, polycarbonate, polyarylate, polyether imide, polyether sulfonate, polyimide, or polyacrylate.

Meanwhile, the first substrate 310 and/or the second substrate 320 may have a particular thickness (for example, 25 μm to 50 μm) determined based on considerations such as reliability, bendability, and visibility.

The resistor 340 is disposed on one surface of the first substrate 310 (a surface facing the second substrate). The resistor 340 is formed of a high-resistance material. The resistor 340 may be coated on the one surface of the first substrate 310 to a particular thickness (for example, about 10 μm) and may be referred to as a resistive layer.

The driving electrode 331 and the sensing electrode 332 are provided to distinguish the force or strength of a touch input. The driving electrode 331 may also be referred to as a TX electrode or force driving electrode, and the sensing electrode 332 may also be referred to as an RX electrode or force sensing electrode.

The driving electrode 331 and the sensing electrode 332 may be disposed in various manners on one surface of the second substrate 320. For example, as illustrated in FIG. 4 or FIG. 5, the driving electrode 331 may be disposed at a particular distance from one surface of the second substrate 320 (a surface facing the first substrate). Further, the sensing electrode 332 may be disposed adjacent to the driving electrode 331 on the same surface. However, the driving electrode 331 and the sensing electrode 332 are not directly connected to each other and are instead spaced apart from each other. Meanwhile, the electrodes 331 and 332 may be disposed at a lower density in a specific area (for example, curved area such as flexible area, bent area, and the like). This is to suppress damage to the electrodes caused by bending.

The driving electrode 331 and the sensing electrode 332 are spaced from the resistor 340 at a particular vertical distance (for example, about 40 μm). The vertical distance (gap) is determined considering a sensing range, sensitivity, and the like. A resistance detected when the resistor 340 and the electrodes 331 and 332 are separated from each other has a very high value.

If the touch force sensing device 300 is pressed by a touch input, the sensing electrode 332 is brought into contact with the resistor 340, and the driving electrode 331 is brought into contact with the resistor 340. This causes the sensing electrode 332 to be electrically connected to the driving electrode 331 through the resistor 340. A resistance value R detected at this time is different from an initial value. If the touch input has a high force, a contact area between the resistor 340 and the electrodes 331 and 332 is increased.

Thus, a detected resistance value is decreased. That is, the contact areas and therefore detected resistance value varies depending on the force of a touch input. According to this principle, the touch force sensing device 300 can measure the force of a touch input.

Figure 8:
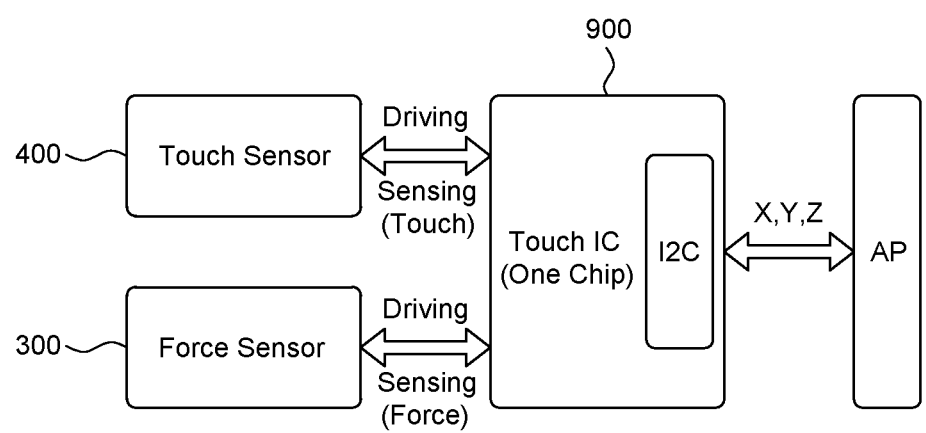
FIG. 8 is a diagram illustrating a circuit that controls a touch position sensing device and a touch force sensing device.

The touch force sensing device 300 may further include the controller. The controller may supply a driving signal (voltage, pulse, and the like.) to the driving electrode 331 and detect a resistance change depending on the force of the external touch input from the sensing electrode 332. In one embodiment, resistance is sensed by applying a fixed voltage signal to the driving electrode 331 and then measuring a voltage at the sensing electrode 332. The measured voltage indicates how much the resistance has changed. In order to distinguish the force of a touch input from the detected resistance change (i.e., raw data), the controller may perform normalization, linearization, and the like to analyze a force and calculate the force. Meanwhile, the controller may be a module implemented within an integrated circuit chip (IC chip) to control both the touch force sensing device 300 and the touch position sensing device 400, as illustrated in FIG. 8.

The touch force sensing device 300 may further include the spacer 350 configured to maintain a gap between the first substrate 310 and the second substrate 320. The spacer 350 may be disposed at a uniform distance from one surface of the first substrate 310 (where the resistor is disposed). A height of the spacer 350 is smaller than a height of the gap (or air-gap) between the first substrate 310 and the second substrate 320. For example, the spacer 350 may have a height that is half or less than the gap between the first substrate 310 and the second substrate 320. For example, if the gap between the first substrate 310 and the second substrate 320 is 40 μm, the height of the spacer 350 may be set to 20 μm or less. Meanwhile, the spacer 350 may be formed of a material having an elastic modulus of 30 Mpa or more. Thus, the spacer 350 as well as the air-gap between the first substrate 310 and the second substrate 320 may function to reduce (absorb) an impact caused by falling, vibration, bonding, and the like. The spacer 350 has a thermal resistance of a predetermined level (for example, 100° C.) or more so as not to be damaged during a manufacturing process.

The touch force sensing device 300 may further include the heat-sink layer 380. The heat-sink layer 380 may be on the outside the first substrate 310 and/or the second substrate 320. As illustrated in FIG. 4, the heat-sink layer 380 may be bonded to the first substrate 310 through an adhesive layer 370. The adhesive layer 370 may be formed of a material such as an optical cleared adhesive (OCA).

The heat-sink layer 380 is configured to dissipate heat generated and transferred from an apparatus (for example, organic light emitting display device) adjacent to the first substrate 310 and/or the second substrate 320. That is, the heat-sink layer 380 rapidly dissipates the heat generated from the apparatus to the outside and thus contributes to cooling of the apparatus. The heat-sink layer 380 may be formed of a conducting polymer, graphite, graphene and the like. The heat-sink layer 380 may include a specific pattern on its one surface. The surface on which the specific pattern is formed has a larger surface area than a plane surface and thus is more effective in heat dissipation. The pattern may have a concave and convex cross section including continuous triangular, sawtooth, rectangular, hemispheric, and trapezoidal shapes along a longitudinal direction. Further, the pattern may be formed into a stripe pattern, an embossing pattern, a wave pattern, a lattice (or grid) pattern and the like when viewed from the top. Instead of or in addition to a layer type heat sink, other forms and structures that achieve the desired heat dissipation, such as a so-called heat pipe, may be employed.

Figure 6:
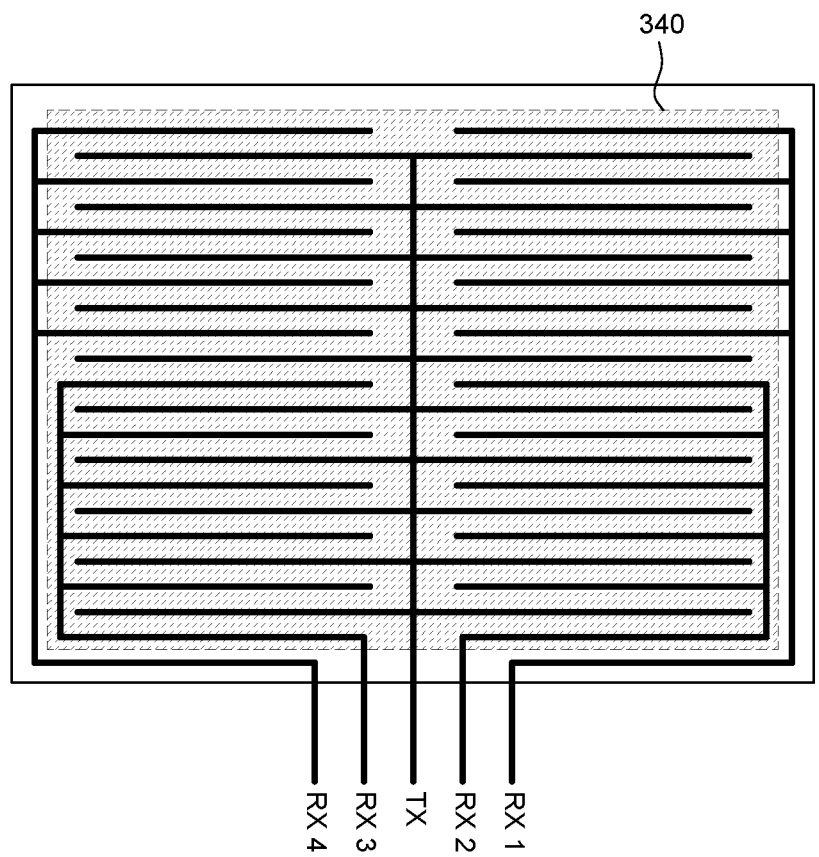
FIG. 6 is a plan view illustrating the layout of electrodes of a touch force sensing device according to an exemplary embodiment of the present disclosure.

FIG. 6 is a plan view illustrating the layout of electrodes of a touch force sensing device according to an exemplary embodiment of the present disclosure.

The electrodes may be a force driving electrode TX and force sensing electrodes RX1, RX2, RX3, and RX4 configured to sense the force of a touch input applied to two or more spots on the display screen. That is, the touch force sensing device 300 according to an exemplary embodiment of the present disclosure may include electrodes configured to sense the force of a touch applied to two or more spots.

Referring to an example illustrated in FIG. 6, the driving electrode TX is a single electrode and the sensing electrodes RX1, RX2, RX3, and RX4 are divided to correspond to a plurality of (four) sections, respectively. RX1 is an upper right display section of the display device. RX2 is in a lower right display section of the display device. RX3 is in a lower left display section of the display device. RX4 is an upper left display section of the display device. Each of the sensing electrodes RX1, RX2, RX3, and RX4 is spaced apart from the driving electrode TX.

Each sensing electrode RX1, RX2, RX3, and RX4 is comb shaped and has several electrode fingers that extend parallel to each other. The first driving electrode TX also has parallel electrode fingers in each of the four display sections of the display device. The electrode fingers of the driving electrode TX are interleaved with the electrode fingers of the sensing electrodes RX1, RX2, RX3, and RX4.

If the sensing electrodes are disposed as such, the force of a touch applied to each of the four sections can be individually detected from changes in resistance between the driving electrode TX and the sensing electrodes RX1, RX2, RX3 and RX4, respectively. The resistor 340 is disposed on an upper side in a vertical direction of the driving electrode TX and the sensing electrodes RX1, RX2, RX3, and RX4.

The number of touch force sensing sections can be determined considering a load transfer mechanism with respect to the sensing device and a channel/size/price/performance of the control circuit. The force of the touch in each display section is detected based on a change in resistance between the driving electrode TX and a respective sensing electrode RX1, Rx2, RX3 and RX4.

Figure 7:
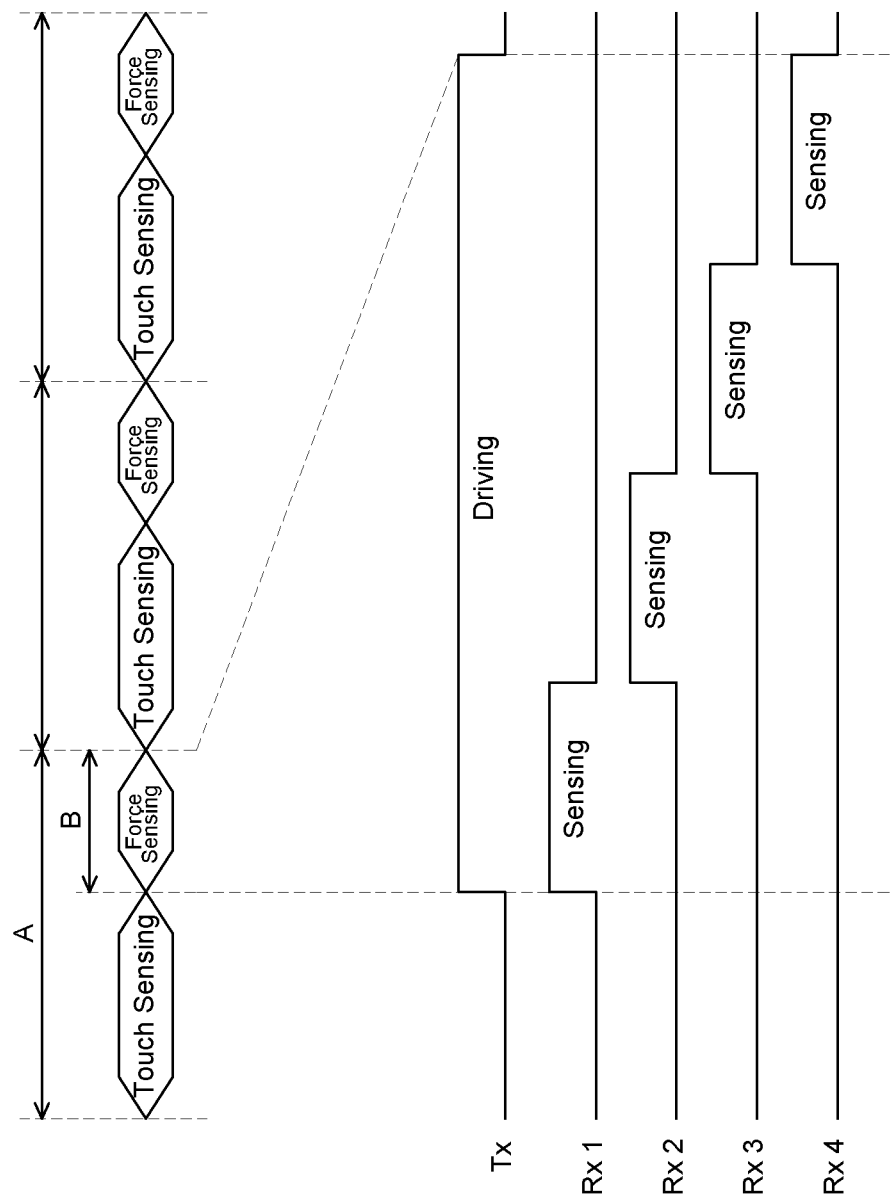
FIG. 7 is a diagram illustrating operation timing of the touch force sensing device illustrated in FIG. 6.

FIG. 7 is a diagram illustrating an operation timing of the touch force sensing device illustrated in FIG. 6.

It is assumed that the touch sensing device according to an exemplary embodiment of the present disclosure performs touch position sensing (touch sensing) and touch force sensing (force sensing) in a time-sharing manner. However, a touch sensing method is not limited thereto. A touch sensing device according to the present disclosure may perform touch position sensing and touch force sensing separately or simultaneously.

The touch sensing time periods and the force sensing time periods alternate with each other. A touch sensing device according to an exemplary embodiment of the present disclosure may perform touch sensing in portion of a specific time period A, and perform touch force sensing for each partial section of time B in a specific time period A. In the section of time B, a force sensor driving signal (voltage, pulse, and the like) is applied to the driving electrode TX. Further, as illustrated in FIG. 7, the force of a touch is checked/detected in sequence at different times from signals received from the sensing electrodes RX1, RX2, RX3, and RX4 corresponding to the four sections. Although FIG. 7 illustrates that the force of a touch is checked/detected in sequence, the force of a touch may be checked/detected from all sensing electrodes RX1, RX2, RX3, and RX4 at the same time.

FIG. 8 is a diagram illustrating a circuit that controls a touch position sensing device and a touch force sensing device.

A control circuit 900 may be a module implemented within an integrated circuit chip (IC chip) to control both the touch force sensing device (force sensor) 300 and the touch position sensing device (touch sensor) 400, as illustrated in FIG. 8. In this case, the control circuit 900 transmits a driving signal to the touch sensor 400 and the force sensor 300 in sequence or at the same time, and then analyzes/collects information (position and force) about a touch input detected accordingly. Further, the control circuit 900 transfers the information about the touch input to a necessary functional unit (or module). For example, the control circuit 900 may transfer information (X, Y, and Z) about the touch input to an application processor AP.

Meanwhile, the resistive force sensor according to an exemplary embodiment of the present disclosure may have a change in resistance value depending on temperature. In one embodiment, the resistive force sensor can compensate for a change in resistance value depending on temperature by getting temperature information from a separate temperature sensor. In another embodiment, when the force sensor cannot get (or recognize) a temperature change, the force sensor may detect a temperature change from a capacitance change of the touch sensor and compensate for a change in resistance value depending on a temperature using the detection result. For example, the force sensor may detect a capacitance change of the touch sensor in sensing duration or non-sensing duration, and acquire an expected temperature from a database or a lookup table corresponding to the sensed value of the capacitance change. Then the force sensor may compensate for a change in resistance value depending on temperature or dynamically modify an operation condition of the force sensor by using a particular algorithm for temperature compensation based on the expected temperature. Such a series of operations may be performed by the control circuit 900. Accordingly, the performance of the force sensor can be stably secured.

The exemplary embodiments of the present disclosure can also be described as follows:

According to an aspect of the present disclosure, a touch force sensing device includes a first substrate, a resistor on one surface of the first substrate, a second substrate facing the first substrate, a driving electrode disposed on a surface of the second substrate facing the first substrate and spaced from the resistor, and a sensing electrode disposed on the same surface as the driving electrode and electrically connected to the driving electrode through the resistor by an external touch input.

The touch force sensing device may further include a controller that supplies a driving signal to the driving electrode and detects a resistance change depending on the intensity of the external touch input from the sensing electrode.

The sensing electrode may be configured to sense the intensity of a touch input applied to two or more spots.

The sensing electrode may be divided corresponding to each of a plurality of sections.

The touch force sensing device may further include a spacer configured to maintain a gap between the first substrate and the second substrate.

The spacer may have a height half or less of the gap between the first substrate and the second substrate and may have an elastic modulus of 40 Mpa or more.

The touch force sensing device may further include a heat-sink layer on an outer surface of the first substrate or the second substrate. The heat-sink layer may be configured to dissipate heat transferred from an apparatus adjacent to the first substrate or the second substrate.

The heat-sink layer may be formed of any one or more materials of a conducting polymer, graphite, and graphene.

The first substrate or the second substrate may be formed of polyethylene terephthalate and may have a thickness of 25 to 50 micrometers (µm).

According to another aspect of the present disclosure, an electronic device includes the touch force sensing device.

According to yet another aspect of the present disclosure, an organic light emitting display device includes a flexible substrate, an organic light emitting diode disposed on a first surface of the flexible substrate, and a force sensor on a second surface opposite to the first surface of the flexible substrate. The force sensor is configured to detect a resistance which is changed depending on the intensity of a touch input using a resistor and an electrode spaced from each other at a predetermined distance.

The force sensor may include electrodes divided respectively corresponding to a plurality of sections in order to sense the intensity of a touch input applied to two or more spots.

The organic light emitting display device may further include a touch sensor configured to sense a position of the touch input.

The organic light emitting display device may further include an integrated chip (IC chip) configured to control both the force sensor and the touch sensor.

The force sensor may be configured to compensate a change in resistance value depending on a temperature.

The force sensor may detect a temperature change on the basis of a capacitance change of the touch sensor.

The organic light emitting display device may further include a support layer positioned between the flexible substrate and the force sensor.

The organic light emitting display device may further include a heat-sink layer positioned between the flexible substrate and the force sensor. The heat-sink layer may dissipate heat transferred from the flexible substrate.

The electrode of the force sensor may be disposed at a lower density in an area where the flexible substrate is bent.

The distance between the resistor and the electrode provided within the force sensor may reduce an impact applied to the organic light emitting display device.

In one embodiment, a display device comprises a display panel and a touch force sensing device overlapping with the display panel. The touch force sensing device comprises a force driving electrode and a first force sensing electrode spaced apart from the force driving electrode. A resistor is separated from the force driving electrode and the first force sensing electrode by a gap. A contact area between the force driving electrode and the resistor varies depending on a force of a touch, and a contact area between the first force sensing electrode and the resistor varies depending on the force of the touch.

In one embodiment, the force sensing device further comprises a second force sensing electrode spaced apart from the force driving electrode. The second force sensing electrode is separated from the resistor by the gap. A contact area between the first force sensing electrode and the resistor varies depending on the force of the touch. In one embodiment, the force driving electrode is located in a first display section and a second display section of the display device. The first display section and the second display section are different sections from a plan view of the display device. The first force sensing electrode is in the first display section of the display device. The second force sensing electrode is in the second display section of the display device.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The features of various exemplary embodiments of the present disclosure can be partially or entirely bonded to or combined with each other and can be interlocked and operated in technically various ways by a person having ordinary skill in the art, and the various exemplary embodiments can be carried out independently of or in association with each other.

The protective scope of the present disclosure should be construed based on the following claims, and all the technical concepts in the equivalent scope thereof should be construed as falling within the scope of the present disclosure.

What is claimed is:

1. A display device comprising:
a display panel; and
a touch force sensing device overlapping with the display panel, the touch force sensing device comprising:
a force driving electrode;
a first force sensing electrode spaced apart from the force driving electrode; and
a resistor separated from the force driving electrode and the first force sensing electrode by a gap when a touch force is not present,
wherein the force driving electrode, the first force sensing electrode, and the resistor are structured such that first respective contact areas are present between the force driving electrode and the resistor and between the first force sensing electrode and the resistor in response to a touch having a first touch force, and second respective contact areas greater than the first respective contact areas are present between the force driving electrode and the resistor and between the first force sensing electrode and the resistor in response to the touch having a second touch force greater than the first touch force,
wherein a conduction path between the force driving electrode and the first force sensing electrode has a first resistance in response to the first respective contact areas being present, and the conduction path has a second resistance lower than the first resistance in response to the second contact areas being present.

2. The display device of claim 1, further comprising a spacer in the gap.

3. The display device of claim 2, wherein a height of the spacer is smaller than a height of the gap.

4. The display device of claim 1, wherein the force sensing device further comprises:
a second force sensing electrode spaced apart from the force driving electrode, the second force sensing electrode separated from the resistor by the gap, wherein a third contact area between the second force sensing electrode and the resistor varies depending on the force of the touch,
wherein the force driving electrode is located in a first display section and a second display section of the display device, the first display section and the second display section offset from each other in a plan view of the display device,
wherein the first force sensing electrode is in the first display section of the display device, and
wherein the second force sensing electrode is in the second display section of the display device.

5. The display device of claim 4, further comprising a control circuit configured to:
detect the force of the touch in the first display section of the display device based on a change of resistance between the force driving electrode and the first force sensing electrode; and
detect the force of the touch in the second display section of the display device based on a change of resistance between the force driving electrode and the second force sensing electrode.

6. The display device of claim 5, wherein the control circuit detects the force of the touch in the first display section and the force of the touch in the second display section at different times.

7. The display device of claim 4,
wherein the force driving electrode comprises a plurality of first force driving electrode fingers in the first display section and a plurality of second force driving electrode fingers in the second display section;
wherein the first force sensing electrode comprises a plurality of first force sensing electrode fingers that are interleaved with the first force driving electrode fingers,
wherein the second force sensing electrode comprises a plurality of second force sensing electrode fingers that are interleaved with the second force driving electrode fingers.

8. The display device of claim 4, wherein the force sensing device further comprises:
a third force sensing electrode spaced apart from the force driving electrode, the third force sensing electrode separated from the resistor by the gap; and
a fourth force sensing electrode spaced apart from the force driving electrode, the third force sensing electrode separated from the resistor by the gap,
wherein the force driving electrode is located in a third display section and a fourth display section of the display device, the first, second, third and fourth display sections being offset from each other in a plan view of the display device,
wherein the third force sensing electrode is in the third display section of the display device, and
wherein the fourth force sensing electrode is in the fourth display section of the display device.

9. The display device of claim 1, further comprising a touch position sensing device overlapping with the display panel, wherein the touch position sensing device is located at a first side of the display panel and the touch force sensing device is located at a second side of the display panel opposite to the first side.

10. The display device of claim 9, wherein the display device alternates between sensing positon of the touch via the touch position sensing device and sensing force of the touch via the touch force sensing device.

11. The display device of claim 1, wherein the touch force sensing device comprises:

a first substrate, wherein the resistor is disposed on a surface of the first substrate; and a second substrate, wherein the force driving electrode and the first force sensing electrode are disposed on a surface of the second substrate.

12. The display device of claim 1, further comprising:

a control circuit to sense a change of resistance in the conduction path between the force driving electrode and the first force sensing electrode, and to detect the force of the touch based on the change of resistance.

13. The display device of claim 1, wherein the force driving electrode comprises a plurality of first force driving electrode fingers in a first display section and a plurality of second force driving electrode fingers in the second display section, wherein the first force driving electrode fingers are electrically coupled with the second force driving electrode fingers, wherein the first force sensing electrode comprises a plurality of first force sensing electrode fingers that are interleaved with the first force driving electrode fingers, and wherein the force sensor comprises a second force sensing electrode comprising a plurality of second force sensing electrode fingers that are interleaved with the second force driving electrode fingers, the second force sensing electrode electrically decoupled from the first force sensing electrode.

14. An organic light emitting display device comprising:
a flexible substrate;
an organic light emitting diode on a first surface of the flexible substrate; and
a force sensor on a second surface opposite to the first surface of the flexible substrate, wherein the force sensor comprises:
  a force driving electrode;
  a first force sensing electrode spaced apart from the force driving electrode; and
  a resistor separated from the force driving electrode and the first force sensing electrode by a gap when a touch force is not present,
  wherein the force driving electrode, the first force sensing electrode, and the resistor are structured such that first respective contact areas are present between the force driving electrode and the resistor and between the first force sensing electrode and the resistor in response to a touch having a first touch force, and second respective contact areas greater than the first respective contact areas are present between the force driving electrode and the resistor and between the first force sensing electrode and the resistor in response to the touch having a second touch force greater than the first touch force
  wherein a conduction path between the force driving electrode and the first force sensing electrode has a first resistance in response to the first respective contact areas being present, and the conduction path has a second resistance lower than the first resistance in response to the second contact areas being present.

15. The organic light emitting display device according to claim 14, wherein the force sensor further includes at least a second force sensing electrode, wherein the first force sensing electrode and the second force sensing electrode are positioned in different sections of the organic light emitting display device in order to sense the intensity of a touch input applied to two or more spots on the organic light emitting display device.

16. The organic light emitting display device according to claim 14, further comprising:
  a touch sensor configured to sense a position of the touch input; and
  an integrated circuit (IC) chip configured to control both the force sensor and the touch sensor.

17. The organic light emitting display device according to claim 14, wherein the force sensor is configured to compensate a change in resistance value depending on temperature.

18. The organic light emitting display device according to claim 17, wherein the force sensor detects a temperature change on the basis of a capacitance change of the touch sensor.

19. The organic light emitting display device according to claim 14, further comprising:
  a heat-sink layer between the flexible substrate and the force sensor, and
  wherein the heat-sink layer is configured to dissipate heat from the flexible substrate.

20. The organic light emitting display device according to claim 14, wherein the electrode of the force sensor has a lower density in an area where the flexible substrate is bendable or bent.

21. The organic light emitting display device according to claim 14, wherein the gap between the resistor and the electrode provided within the force sensor is sufficient to accommodate undesirable impacts applied to the organic light emitting display device.

* * * * *